(12) United States Patent
Xie et al.

(10) Patent No.: US 10,978,574 B2
(45) Date of Patent: Apr. 13, 2021

(54) FLOATING GATE PREVENTION AND CAPACITANCE REDUCTION IN SEMICONDUCTOR DEVICES

(71) Applicant: International Business Machines Corporation, Armonk, NY (US)

(72) Inventors: Ruilong Xie, Niskayuna, NY (US); Kangguo Cheng, Schenectady, NY (US); Chanro Park, Clifton Park, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/504,762

(22) Filed: Jul. 8, 2019

(65) Prior Publication Data
US 2021/0013322 A1  Jan. 14, 2021

(51) Int. Cl.
*H01L 29/66* (2006.01)
*H01L 21/762* (2006.01)
*H01L 21/8234* (2006.01)
*H01L 29/78* (2006.01)
*H01L 27/088* (2006.01)

(52) U.S. Cl.
CPC .. *H01L 29/66545* (2013.01); *H01L 21/76224* (2013.01); *H01L 21/823431* (2013.01); *H01L 27/0886* (2013.01); *H01L 29/6653* (2013.01); *H01L 29/6656* (2013.01); *H01L 29/66795* (2013.01); *H01L 29/785* (2013.01)

(58) Field of Classification Search
CPC ....... H01L 29/66545; H01L 21/823431; H01L 27/0886; H01L 29/66795; H01L 29/6653; H01L 29/785; H01L 21/76224; H01L 29/6656
See application file for complete search history.

(56) References Cited

U.S. PATENT DOCUMENTS 8,362,574 B2   1/2013   Kawasaki et al.
8,637,384 B2   1/2014   Ando et al.
(Continued)

OTHER PUBLICATIONS

K. Cheng et al., "Air Spacer for 10nm FinFET CMOS and Beyond," IEEE International Electron Devices Meeting (IEDM), Dec. 3-7, 2016, pp. 17.1.1-17.1.4.

*Primary Examiner* — Fernando L Toledo
*Assistant Examiner* — Adam S Bowen
(74) *Attorney, Agent, or Firm* — Douglas Pearson; Ryan, Mason & Lewis, LLP (57) ABSTRACT

A method for fabricating a semiconductor structure includes forming a plurality of vertical fins on a semiconductor substrate. The method further includes depositing a first dielectric layer in a shallow trench isolation region on the semiconductor substrate. The method further includes forming a plurality of dummy gate structures over each of the vertical fins. The method further includes depositing a hardmask on the dummy gate. The method further includes depositing a spacer layer on the exterior surfaces of the first dielectric layer, the dummy gate structures, the hardmask and the fins. The method further includes depositing a second dielectric layer on a portion of the spacer layer. The method further includes recessing spacer layer to expose a portion of the hardmask and the plurality of fins. The method further includes forming a source/drain region on the exposed portion of the plurality of fins.

20 Claims, 8 Drawing Sheets

(56) References Cited

U.S. PATENT DOCUMENTS

| | | |
|---|---|---|
| 8,999,779 B2 | 4/2015 | Naczas et al. |
| 9,281,382 B2 | 3/2016 | Liu et al. |
| 9,564,358 B1 | 2/2017 | Cai et al. |
| 9,773,708 B1 * | 9/2017 | Zhang ............... H01L 29/66545 |
| 9,825,044 B2 | 11/2017 | Pranatharthiharan et al. |
| 9,865,704 B2 | 1/2018 | Xie et al. |
| 9,899,515 B1 * | 2/2018 | Cheng ............... H01L 29/41741 |
| 10,181,527 B2 | 1/2019 | Palle et al. |
| 2014/0203376 A1 | 7/2014 | Xie et al. |
| 2015/0060960 A1 | 3/2015 | Xie et al. |
| 2019/0355827 A1 * | 11/2019 | Ching ............... H01L 29/4983 |

* cited by examiner

FLOATING GATE PREVENTION AND CAPACITANCE REDUCTION IN SEMICONDUCTOR DEVICES

BACKGROUND

In modern integrated circuits, such as microprocessors, storage devices and the like, a very large number of circuit elements, especially transistors, are provided on a restricted chip area. Transistors come in a variety of shapes and forms, e.g., planar transistors, Fin Field Effect Transistors (Fin-FET), nanowire devices, etc. The transistors are typically either NMOS (NFET) (N-type Metal Oxide Semiconductor) or PMOS (PFET) (P-type Metal Oxide Semiconductor) type devices wherein the "N" and "P" designation is based upon the type of dopants used to create the source/drain regions of the devices. So-called CMOS (Complementary Metal Oxide Semiconductor) technology or products refer to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

A FinFET device capacitance may be partitioned into gate capacitance and parasitic capacitance. The gate capacitance is an essential component of the device operation, and while the gate capacitance may generally decrease with scaling, the parasitic capacitance may not necessarily decrease. In fact, of the various contributions to device parasitic capacitance, such as gate-to-sidewall fringe, gate-to-source/drain epi fringe coupling, gate-to-source/drain plug coupling (also referred to as MOL capacitance), etc., the fringe capacitance may not decrease with scaling.

SUMMARY

Embodiments described herein provide methods of forming semiconductor devices. For example, one exemplary embodiment includes a method for fabricating a semiconductor structure comprises forming a plurality of vertical fins on a semiconductor substrate. The method further comprises depositing a first dielectric layer in a shallow trench isolation region on the semiconductor substrate. The method further comprises forming a plurality of dummy gate structures over each of the vertical fins. The method further comprises depositing a hardmask on the dummy gate. The method further comprises depositing a spacer layer on the exterior surfaces of the first dielectric layer, the dummy gate structures, the hardmask and the fins. The method further comprises depositing a second dielectric layer on a portion of the spacer layer. The method further comprises recessing the spacer layer to expose a portion of the hardmask and the plurality of fins. The method further comprises forming a source/drain region on the exposed portion of the plurality of fins.

Another exemplary embodiment includes a semiconductor structure comprising a semiconductor substrate having a plurality of vertical fins. The semiconductor structure further comprises a first dielectric layer disposed in a shallow trench isolation region on a top surface of the semiconductor substrate. The semiconductor structure further comprises a plurality of dummy gate structures over each of the vertical fins. The semiconductor structure further comprises a hardmask disposed on the dummy gate structures. The semiconductor structure further comprises a recessed spacer layer on the exterior surfaces of the first dielectric layer, the dummy gate structures, the hardmask and the fins exposing a portion of the hardmask and the plurality of fins. The semiconductor structure further comprises a second dielectric layer disposed on a portion of the spacer layer. The semiconductor structure further comprises a source/drain region on the exposed portion of the plurality of fins.

These and other features, objects and advantages of the present invention will become apparent from the following detailed description of illustrative embodiments thereof, which is to be read in connection with the accompanying drawings.

DETAILED DESCRIPTION

The present invention generally relates to semiconductor devices and methods for their fabrication. As stated above, a FinFET device capacitance may be partitioned into gate capacitance and parasitic capacitance. When a shared source/drain (S/D) contact is formed over the NMOS/PMOS boundary, if contact depth is not well controlled, it will form a relatively large parasitic capacitor between the S/D contact and gate metal, causing additional resistor-capacitor circuit (RC circuit) delay which slows down the circuit performance. In addition, during CMOS S/D epi formation, a number of etch and wet clean processes are used which could attack the $SiO_2$. If shallow trench isolation (STI) dielectric is not well protected, and if gate length is small, there is a floating gate issue caused by a STI undercut during CMOS spacer/epi module. Therefore, there is a need to prevent formation of the floating gate and to reduce parasitic capacitance over the STI region at NFET and PFET boundaries.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for forming a semiconductor device will be described below with reference to FIGS. 1A-8B. Note that the same reference numeral (100) is used to denote the semiconductor structure throughout the various intermediate fabrication stages illustrated in FIGS. 1A through 8B. Note also that the semiconductor structure described herein can also be considered to be a semiconductor device and/or an integrated circuit, or some part thereof. For the purpose of clarity, some fabrication steps leading up to the production of the semiconductor structure as illustrated in FIGS. 1A-8B are omitted. In other words, one or more well-known processing steps which are not illustrated but are well-known to those of ordinary skill in the art have not been included in the figures.

Figure 1A:
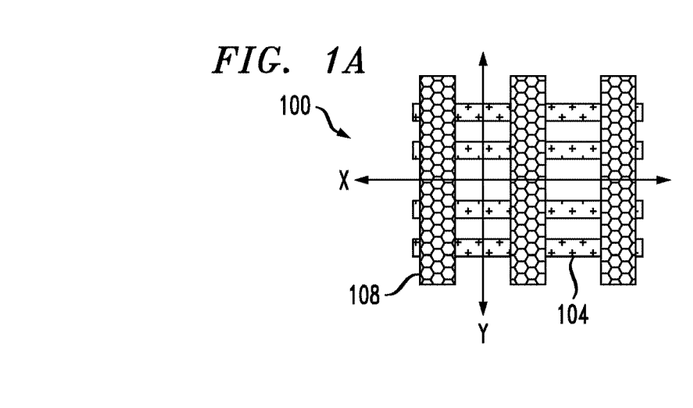
FIG. 1A is a top view of a semiconductor structure after a plurality of fins has been formed on a semiconductor substrate, according to an illustrative embodiment.
Figure 1B:
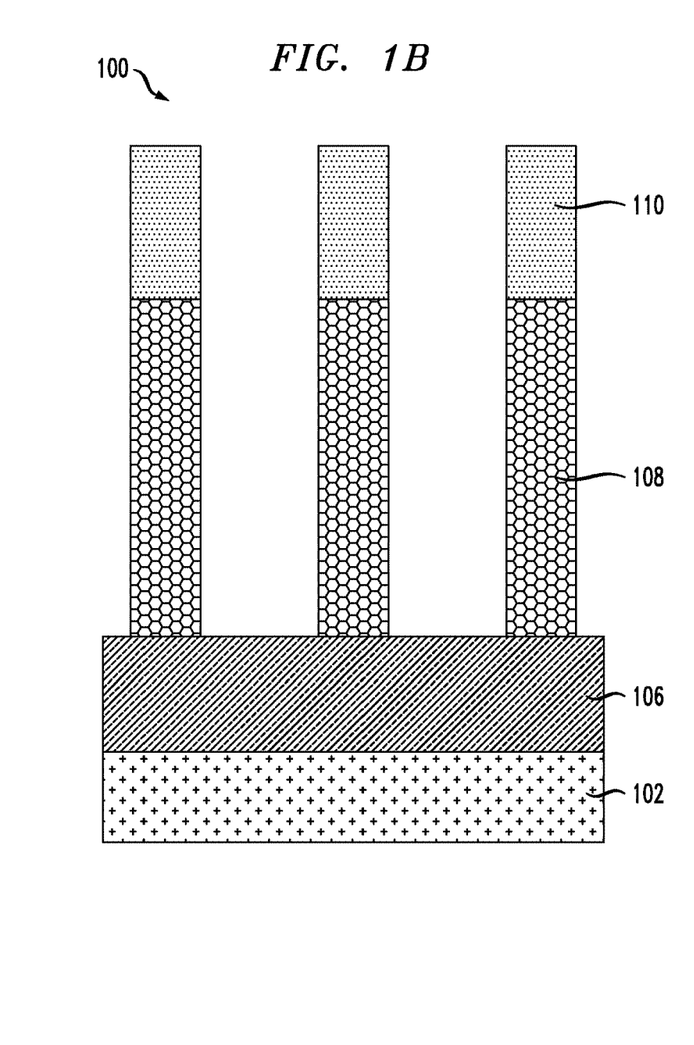
FIG. 1B is a cross sectional view of a semiconductor structure taken along the X axis of FIG. 1A at a first-intermediate fabrication stage, according to an illustrative embodiment.
Figure 1C:
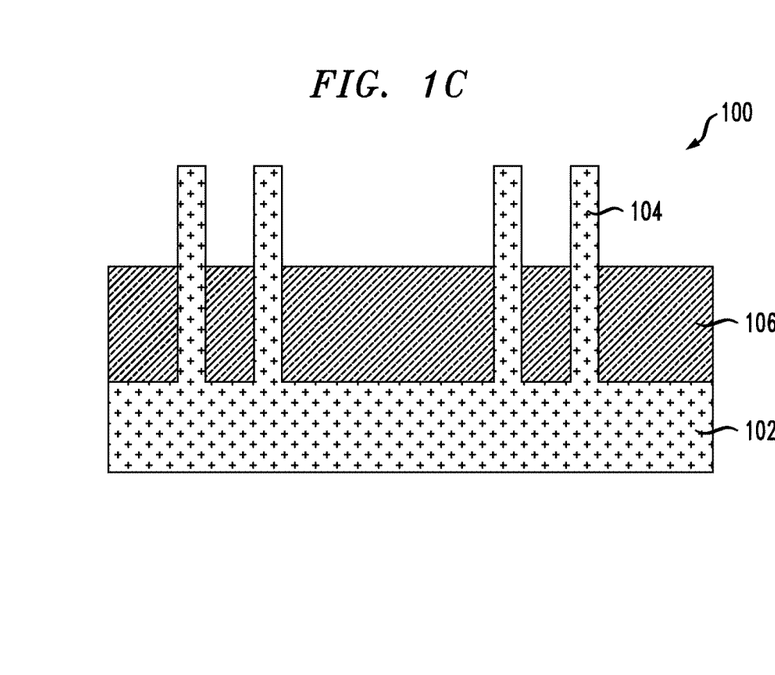
FIG. 1C is a cross sectional view of a semiconductor structure taken along the Y axis of FIG. 1A at a first-intermediate fabrication stage, according to an illustrative embodiment.

FIG. 1A illustrates a top view of semiconductor structure 100 after a plurality of fins 104 have been formed on a semiconductor substrate (not shown). FIG. 1B is a cross sectional view of semiconductor structure 100 taken along the X axis of FIG. 1A. FIG. 1C is a cross sectional view of semiconductor structure 100 taken along the Y axis of FIG. 1A. In this exemplary embodiment, substrate 102 is composed of silicon. In another embodiment, the semiconductor substrate 102 is comprised of a semiconductor material including, but not limited to, silicon, germanium, a silicon-germanium alloy, a silicon carbon alloy, a silicon-germanium-carbon alloy, gallium arsenide, indium arsenide, indium phosphide, group III-V compound semiconductor materials, group II-VI compound semiconductor materials, organic semiconductor materials, or other compound semiconductor materials. However, the semiconductor substrate may be comprised of any material suitable for use in accordance with the embodiments described herein. The fins 104 are defined on substrate 102 using any standard etching processes know in the art. For example, fin patterns may be formed and etched into substrate 102 using known photolithography techniques.

Referring now to FIGS. 1B and 1C, FIG. 1C depicts semiconductor device 100 after the creation of device regions on starting semiconductor substrate 102 through shallow trench isolation (STI). In this exemplary embodiment, device regions are created through STI region 106 within substrate 102. In one embodiment, the shallow trenches are filled with one or more dielectric materials, such as $SiO_2$ or other oxide materials, to isolate the fins from each other. This prevents electrical leakage between adjacent semiconductor device components, preventing one device region from affecting another device region or shorting out through contact with another. After the deposition of dielectric materials to fill STI region 106, a standard planarization process known in the art may be performed, such as chemical mechanical polishing (CMP) and/or grinding.

FIG. 1B shows STI region 106 with dummy gates 108 disposed thereon. Dummy gate 108 can be formed by first depositing a thin dielectric layer (not shown) on STI 106 and on the sidewalls of fins 104, followed by a dummy gate material deposition. The dummy gate structure 108 includes a suitable dummy gate material such as polysilicon or amorphous silicon. The formation of the dummy gate structure 108 is well known to one skilled in the art of FinFET and replacement metal gate (RMG) processes. In one embodiment, the dummy gate dielectric material is silicon dioxide and the dummy gate material is amorphous silicon. The dummy gate 108 can be deposited using a deposition process, such as chemical vapor deposition (CVD), atomic layer deposition (ALD), plasma enhanced chemical vapor deposition (PECVD), metal organic chemical vapor deposition (MOCVD) or other like chemical vapor deposition processes. Next, hardmask 110 is deposited on the top surface of dummy gate 108 using a suitable deposition process, such as CVD, ALD, PECVD, or any other suitable technique. Dummy gate patterning can be achieved using any lithography patterning process (such as extreme-ultraviolet lithography (EUV), self-aligned double patterning (SADP), litho-etch, followed conventional RIE process. After dummy gate ME, post etch clean process including DHF is used to remove any ME residual, and oxide liner over FIN in S/D region (FIG. 1C) is removed during DHF clean.

Figure 2A:
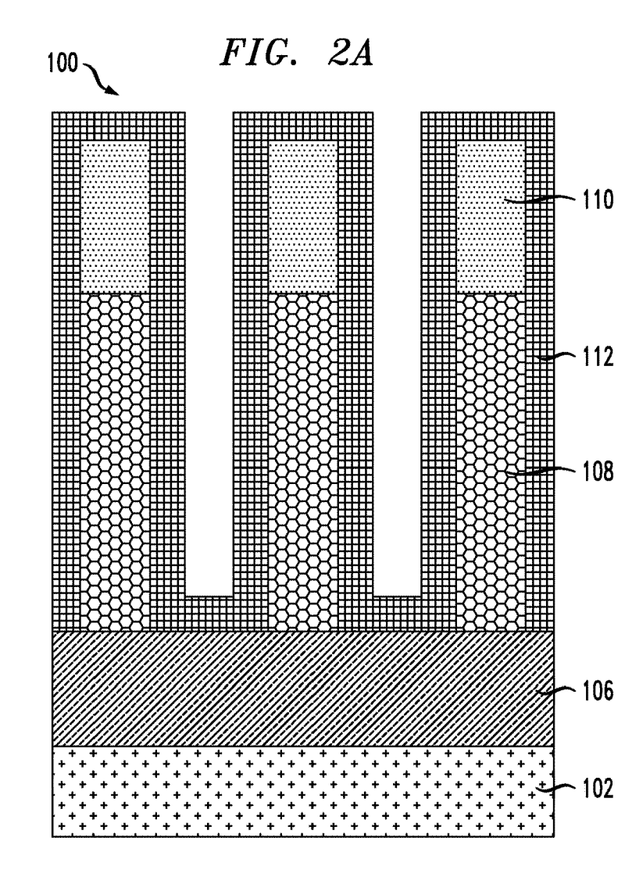
FIG. 2A is a schematic cross-sectional view of a semiconductor structure taken along the X axis of FIG. 1A at a second-intermediate fabrication stage, in accordance with an illustrative embodiment.
Figure 2B:
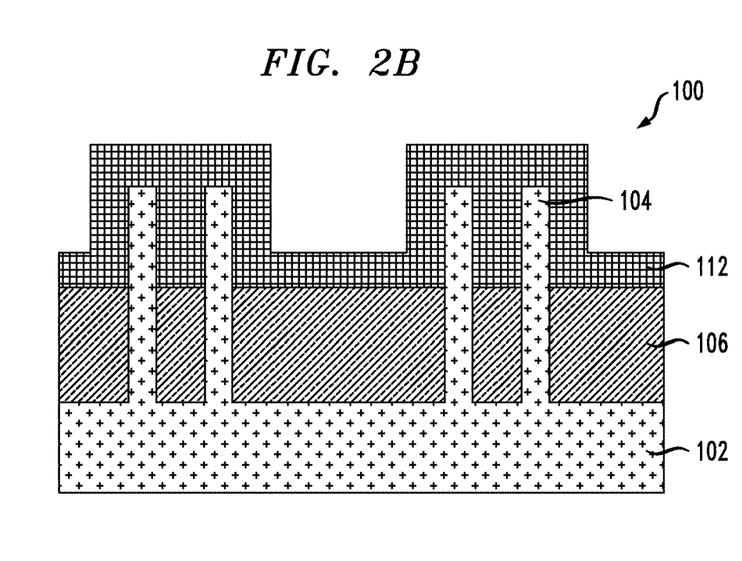
FIG. 2B is a schematic cross-sectional view of a semiconductor structure taken along the Y axis of FIG. 1A at a second-intermediate fabrication stage, in accordance with an illustrative embodiment.

FIG. 2A illustrates a cross-sectional view of semiconductor structure 100 taken along the X axis of FIG. 1A, and FIG. 2B illustrates a cross-sectional view of semiconductor structure 100 taken along the Y axis of FIG. 1A. During this stage, spacers 112 are deposited on the exposed surfaces of semiconductor structure 100. The spacers 112 may be deposited on the exposed surfaces of semiconductor structure 100 by, for example, ALD of a dielectric layer. The spacer 112 may protect the gate structure 108 (e.g., a high-K metal gate structure) and electrically isolate the gate electrode from electrical cross-talk that may occur with any electrical contacts that are formed. Suitable material for spacers 112 includes, for example, a dielectric material. For example, the dielectric materials used to form the gate spacers 108 may include silicon oxide, silicon nitride, silicon oxynitride, SiOCN, SiBCN, SiCO, etc.

Figure 3A:
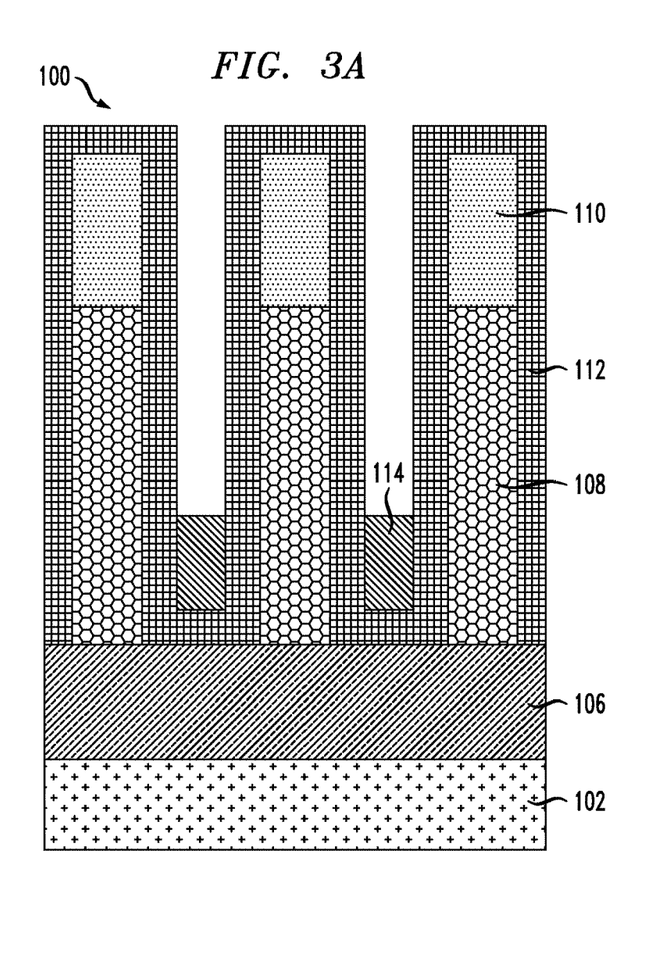
FIG. 3A is a schematic cross-sectional view of a semiconductor structure taken along the X axis of FIG. 1A at a third-intermediate fabrication stage, according to an illustrative embodiment.
Figure 3B:
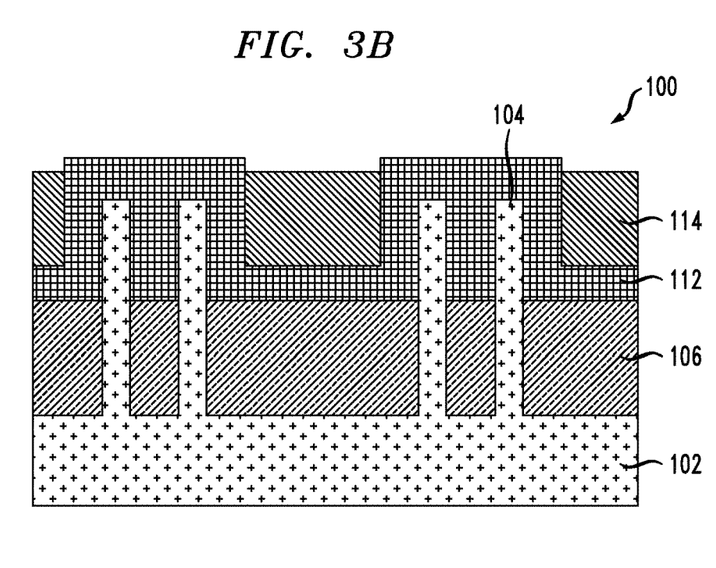
FIG. 3B is a schematic cross-sectional view of a semiconductor structure taken along the Y axis of FIG. 1A at a third-intermediate fabrication stage, according to an illustrative embodiment.

FIG. 3A illustrates a cross-sectional view of semiconductor structure 100 taken along the X axis of FIG. 1A, and FIG. 3B illustrates a cross-sectional view of semiconductor structure 100 taken along the Y axis of FIG. 1A. During this stage, dielectric layer 114 is deposited on spacer 112. Dielectric layer 114 can comprise any dielectric material including, for example, SiC (silicon carbide), $SiO_2$ or any combination thereof. Dielectric layer 114 can be deposited by known techniques, e.g., CVD, ALD, or any other suitable technique. Next, dielectric layer 114 is recessed to a portion below spacer 112 by conventional techniques, e.g., a directional etching technique such as, for example, reactive ion etching (RIE) or isotropic dry or wet etch.

Figure 4A:
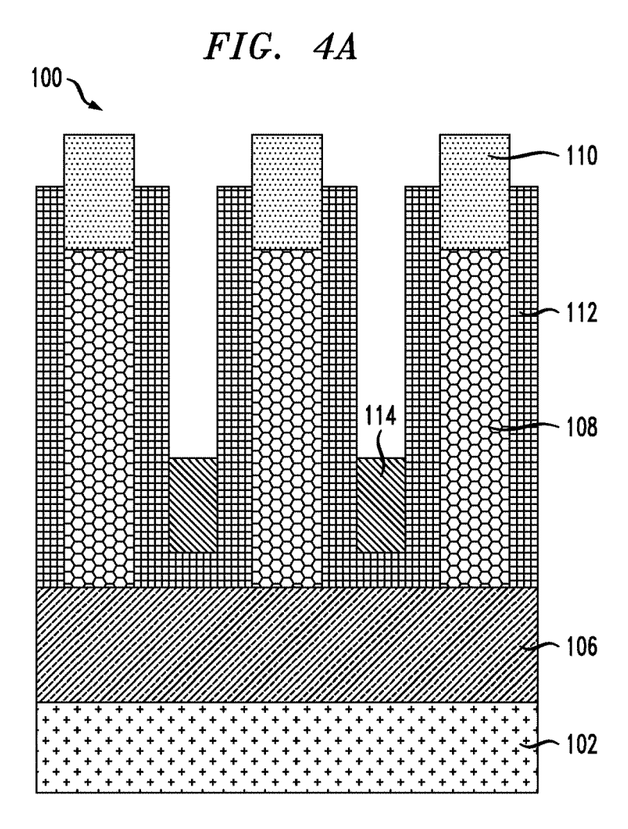
FIG. 4A is a schematic cross-sectional view of a semiconductor structure taken along the X axis of FIG. 1A at a fourth-intermediate fabrication stage, according to an illustrative embodiment.
Figure 4B:
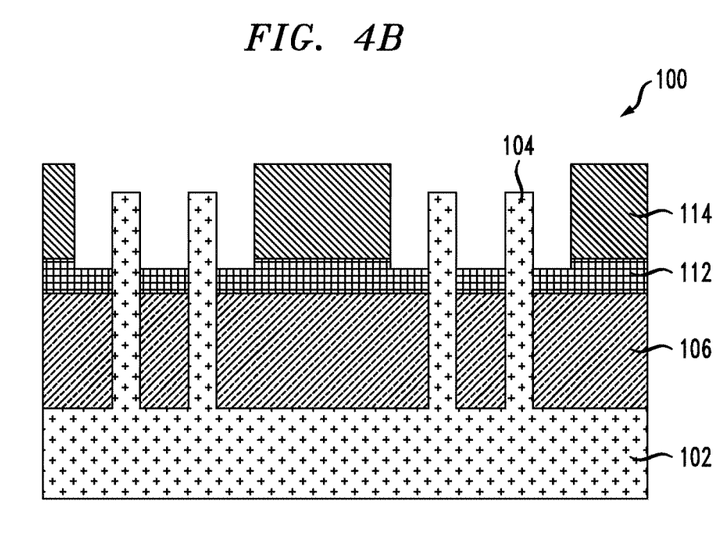
FIG. 4B is a schematic cross-sectional view of a semiconductor structure taken along the Y axis of FIG. 1A at a fourth-intermediate fabrication stage, according to an illustrative embodiment.

FIG. 4A illustrates a cross-sectional view of semiconductor structure 100 taken along the X axis of FIG. 1A, and FIG. 4B illustrates a cross-sectional view of semiconductor structure 100 taken along the Y axis of FIG. 1A. During this stage, spacer 112 is recessed using a directional etching technique such as, for example, RIE. As shown in FIG. 4A, spacer 112 is recessed to a portion below the top surface of hardmask 110 and above the top surface of gate structure 108. As shown in FIG. 4B, spacer 112 is recessed to a position either relatively below, the same or above dielectric layer 114.

Figure 5A:
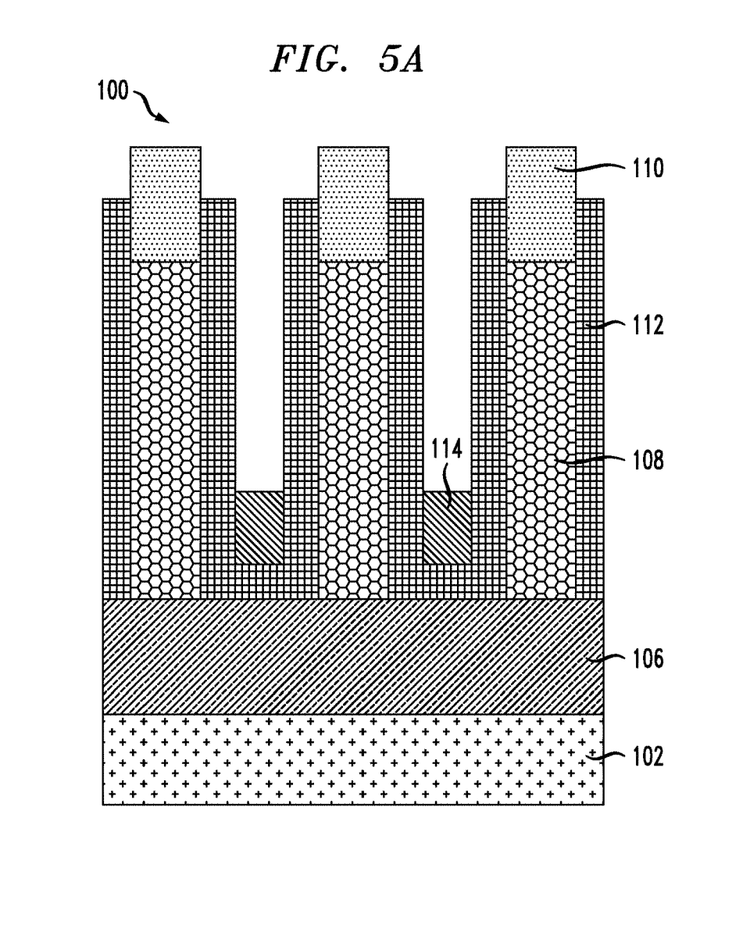
FIG. 5A is a schematic cross-sectional view of a semiconductor structure taken along the X axis of FIG. 1A at a fifth-intermediate fabrication stage, according to an illustrative embodiment.
Figure 5B:
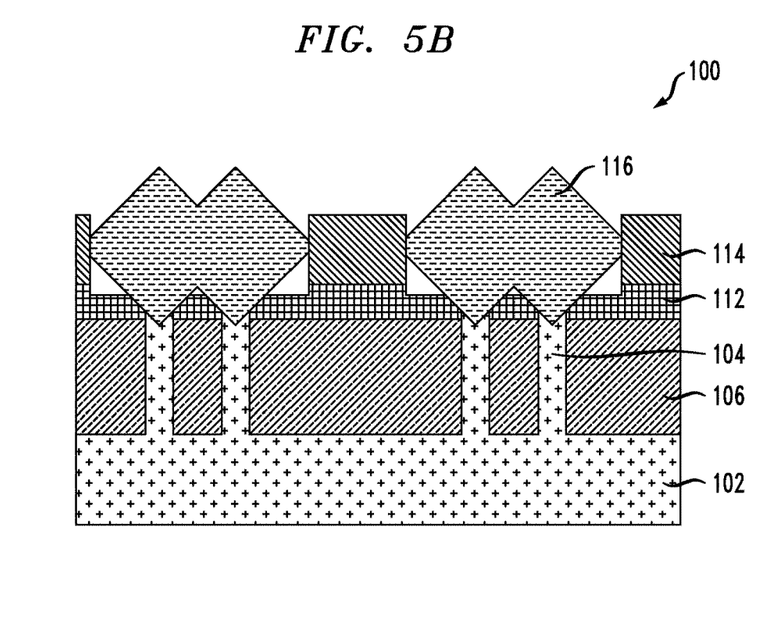
FIG. 5B is a schematic cross-sectional view of a semiconductor structure taken along the Y axis of FIG. 1A at a fifth-intermediate fabrication stage, according to an illustrative embodiment.

FIG. 5A illustrates a cross-sectional view of semiconductor structure 100 taken along the X axis of FIG. 1A, and FIG. 5B illustrates a cross-sectional view of semiconductor structure 100 taken along the Y axis of FIG. 1A. During this stage, S/D regions 116 are formed on the exposed regions of the vertical semiconductor fins 104. In this exemplary embodiment, the S/D regions 116 are formed by growing epitaxial semiconductor material on the exposed surfaces of the S/D regions of the vertical semiconductor fins 104 adjacent to the dummy gate structures. The type of epitaxial material and doping used to form the S/D regions 116 will vary depending on whether the FET devices are P-type or N-type devices. As shown in FIG. 5B, the S/D layers 116 can be epitaxially grown so that adjacent S/D layers 116 formed on adjacent S/D regions of the vertical semiconductor fins can merge to collectively form a single S/D layer. In another embodiment, the S/D regions 116 may be silicide layers that are formed on the exposed surfaces of the S/D regions of the vertical semiconductor fins using known methods. By forming S/D regions 116 in this manner, no damage of STI 106 may occur thereby eliminating any potential floating gate defects because any dry/wet etch processes during S/D formation which could damage STI oxide, are blocked by layer 112 and 114, such that STI oxide is well protected In an embodiment, the S/D regions 116 may be raised S/D regions, in which the doped semiconductor material is grown on an upper surface of the spacer 112. Examples of semiconductor materials that may be suitable for the epitaxial growth of the S/D regions 112 include, but are not limited to, silicon (single crystal, polysilicon, or amorphous), germanium (single crystal, polycrystalline, or amorphous), or a combination thereof. After the semiconductor material is grown, it may be doped with dopant atoms using, for example, in-situ doping or ion implantation or in-situ doping during epitaxy. In an embodiment, the semiconductor material may be doped with a p-type dopant such as, for example, boron, aluminum, gallium, indium, or alloys thereof. In another embodiment, the semiconductor material may be doped with a n-type dopant such as, for example, phosphorus, antimony, arsenic, or alloys thereof. After the doping process, the semiconductor material may have dopant a concentration ranging from approximately $1\times10^{19}$ atoms/cm$^3$ to approximately $5\times10^{21}$ atoms/cm$^3$.

Following doping of the semiconductor material, the semiconductor device 100 may be annealed to activate the dopant atoms and to complete the formation of the S/D regions 116. In an embodiment, the annealing process may include subjecting the structure 100 to an elevated temperature, ranging from approximately 800° C. to approximately 1250° C. for approximately 1 ms to approximately 500 ms. In another embodiment, the annealing process may be a rapid thermal anneal (RTA). In yet another embodiment, the annealing process may be a millisecond anneal such as a laser spike anneal or a flash lamp anneal.

Figure 6A:
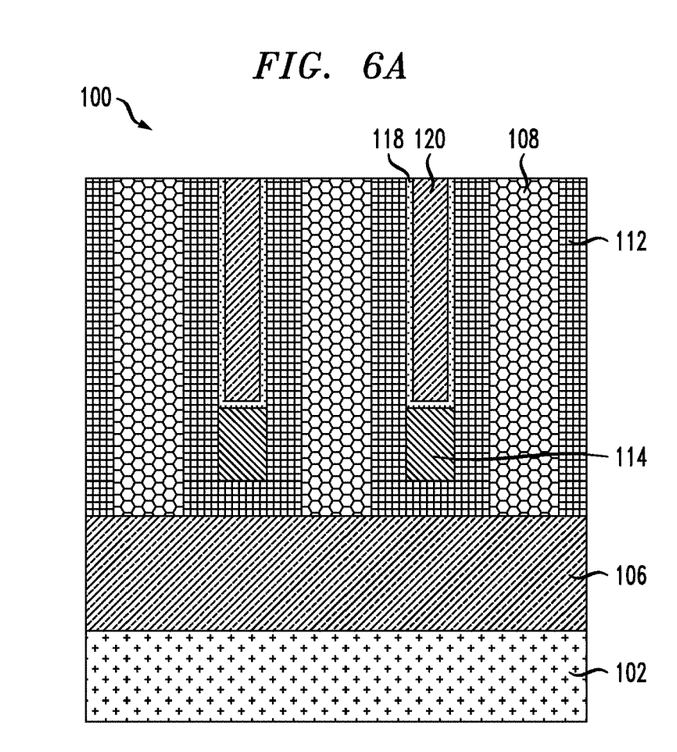
FIG. 6A is a schematic cross-sectional view of a semiconductor structure taken along the X axis of FIG. 1A at a sixth-intermediate fabrication stage, according to an illustrative embodiment.
Figure 6B:
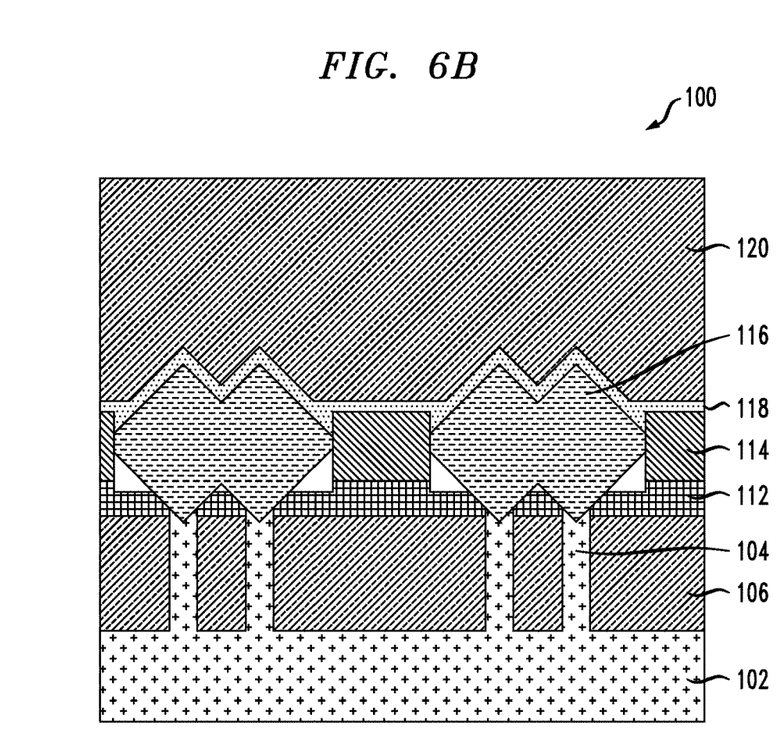
FIG. 6B is a schematic cross-sectional view of a semiconductor structure taken along the Y axis of FIG. 1A at a sixth-intermediate fabrication stage, according to an illustrative embodiment.

FIG. 6A illustrates a cross-sectional view of semiconductor structure 100 taken along the X axis of FIG. 1A, and FIG. 6B illustrates a cross-sectional view of semiconductor structure 100 taken along the Y axis of FIG. 1A. During this stage, a contact etching stop layer (CESL) 118 is formed covering the sidewalls of spacer 112 and the top surface of dielectric layer 114, as shown in FIG. 6A. The CESL 118 is also formed on surfaces of S/D regions 116, and top surfaces of dielectric layer 114, as shown in FIG. 6B. The CESL 118 can provide a mechanism to stop an etch process when forming, for example, contacts or vias. The CESL 118 may be formed of a dielectric material having a different etch selectivity from adjacent layers or components. The CESL 118 may comprise a nitrogen containing material, a silicon containing material, and/or a carbon containing material. In one embodiment, CESL 118 may comprise silicon nitride, silicon carbon nitride, carbon nitride, silicon oxynitride, silicon carbon oxide, the like, or a combination thereof. CESL 118 may be deposited by any suitable deposition process such as, for example, a Plasma Enhanced ALD (PEALD), CVD, or another deposition technique.

Next, an interlevel dielectric (ILD) layer 120 is deposited on CESL 118. The ILD layer 120 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high density plasma oxide, borophosphosilicate glass (BPSG), or any combination thereof. The ILD layer 120 may be formed using any suitable deposition techniques including CVD, ALD, PVD, plasma enhanced chemical vapor deposition (PECVD), chemical solution deposition or other like processes. ILD layer 120 is then planarized by, for example, a planarization process such as a chemical mechanical planarization (CMP).

Figure 7A:
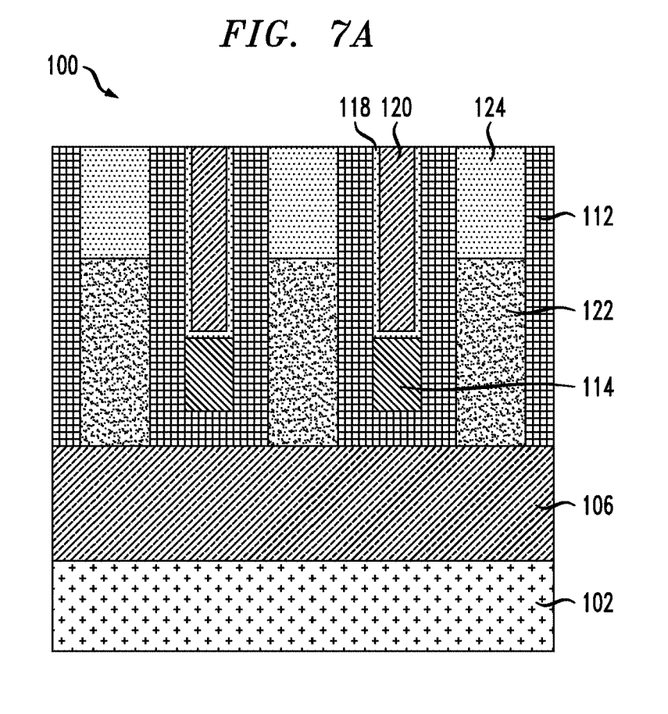
FIG. 7A is a schematic cross-sectional view of a semiconductor structure taken along the X axis of FIG. 1A at a seventh-intermediate fabrication stage, according to an illustrative embodiment.
Figure 7B:
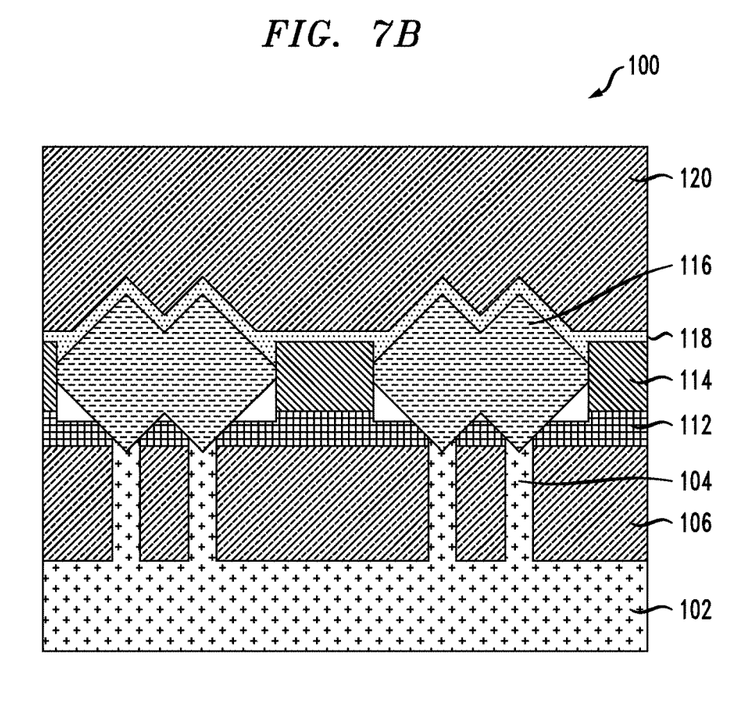
FIG. 7B is a schematic cross-sectional view of a semiconductor structure taken along the Y axis of FIG. 1A at a seventh-intermediate fabrication stage, according to an illustrative embodiment.

FIG. 7A illustrates a cross-sectional view of semiconductor structure 100 taken along the X axis of FIG. 1A, and FIG. 7B illustrates a cross-sectional view of semiconductor structure 100 taken along the Y axis of FIG. 1A. During this stage, dummy gate 108 may be removed by, for example, a poly pull processing to form openings (not shown). Then, as shown in FIG. 7A, a replacement metal gate structure 122 is formed in place of dummy gate 108. Those skilled in the art will recognize that a "replacement metal gate" refers to a gate, which replaces a previously formed dummy gate (also referred to herein as a sacrificial gate, a non-active gate, or a non-gate) and becomes an active component of the semiconductor structure being formed.

More specifically, the dummy gate 108 can be replaced with a replacement metal gate 118 by forming a conformal high-K gate dielectric layer on exposed vertical and horizontal surfaces within the opening. That is, the conformal high-K gate dielectric layer can be formed immediately adjacent to the spacer 112. The high-k dielectric layer may include, for example, a high-k metal oxide based material such as, but not limited to, $HfO_2$, $ZrO_2$, $La_2O_3$, $Al_2O_3$, $TiO_2$, $SrTiO_3$, $LaAlO_3$, $Y_2O_3$, $HfO_3N_y$, $ZrO_xN_y$, $La_2O_xN_y$, $Al_2O_xN_y$, $TiO_xN_y$, $SrTiO_xN_y$, $LaA_1O_xN_y$, or $Y_2O_xN_y$. Next, a gate conductor layer, including one or more gate conductor materials, can be formed on the conformal high-K gate dielectric layer. For example, a conformal first metal can be formed over the conformal high-K gate dielectric layer and a second metal can be deposited onto the conformal first metal (not shown). The first metal can comprise a metal selected so as to have a specific work function appropriate for a given type FET (e.g., an N-type FET or a P-type FET). For example, for a silicon-based N-type FET, the first metal can comprise, for example, hafnium, zirconium, titanium, tantalum, aluminum, or alloys thereof, such as hafnium carbide, zirconium carbide, titanium carbide, tantalum carbide, or aluminum carbide, so that the first metal has a work function similar to that of N-doped polysilicon. For a silicon-based P-type FET, the first metal can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the first metal has a work function similar to that of P-doped polysilicon. The second metal can comprise, for example, a metal fill material (e.g., tungsten). Alternatively, any other suitable configuration of metal and/or metal alloys could be used for the gate conductor layer. Gate structures 122 are formed using a conventional deposition process including, for example, ALD, PVD, molecular layer deposition (MLD), and chemical vapor deposition (CVD), amongst other known processes.

Next, a self-aligned contact (SAC) cap 124 is formed on the top surface of replacement metal gate 122. The terms "SAC cap" and "self-aligned contact cap" may be used interchangeably herein to refer to the protective material over the gate structures 122. The SAC cap material 124 may be, for example, a nitride material such as, silicon nitride (SiN), or another insulating material. Planarization, for example, CMP, may be performed to the device to remove the excess SAC cap material 124 on semiconductor structure 100 to form SAC caps 124, as shown in FIG. 7A.

Figure 8A:
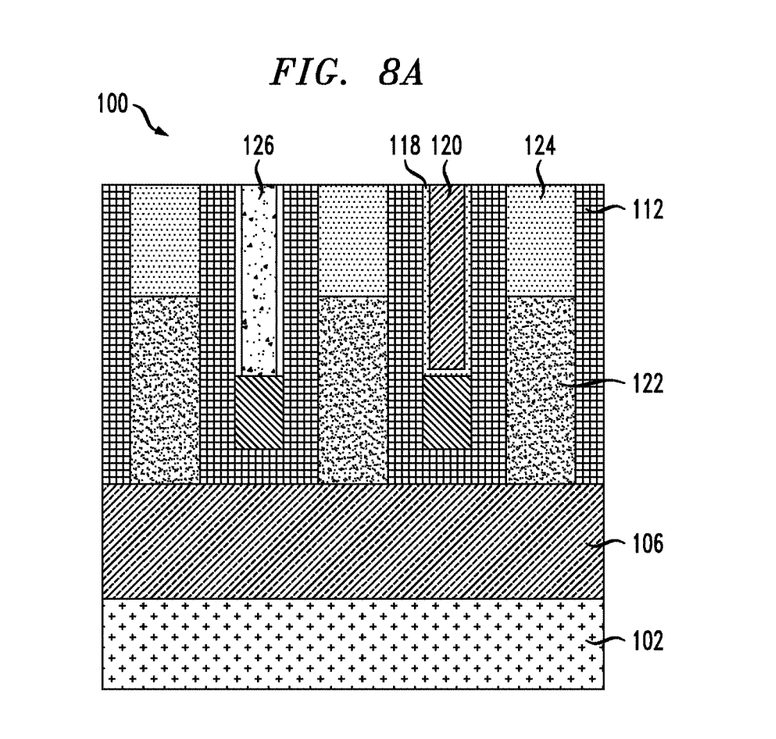
FIG. 8A is a schematic cross-sectional view of a semiconductor structure taken along the X axis of FIG. 1A at an eighth-intermediate fabrication stage, according to an illustrative embodiment.
Figure 8B:
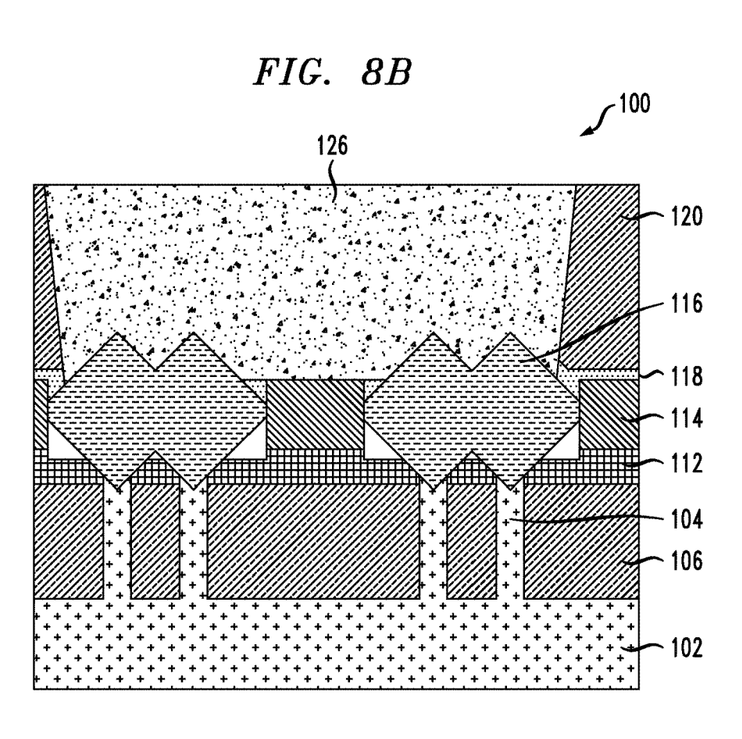
FIG. 8B is a schematic cross-sectional view of a semiconductor structure taken along the Y axis of FIG. 1A at an eighth-intermediate fabrication stage, according to an illustrative embodiment.

FIG. 8A illustrates a cross-sectional view of semiconductor structure 100 taken along the X axis of FIG. 1A, and FIG. 8B illustrates a cross-sectional view of semiconductor structure 100 taken along the Y axis of FIG. 1A. During this stage, ILD layer 120 is patterned using standard lithography patterning followed by etching to create vias for forming S/D contacts 126. S/D contacts 126 are electrical contacts that provide electrical connectivity to the source/drain region. For example, S/D contact 126 is formed by first forming conductive vias or trenches by methods known in the art, e.g., selectively etching through the ILD layer 120 by, for example, RIE, such that the via is communicative with the respective component, e.g., conductive vias or trenches for source/drain contacts 126 communicative with the respective S/D region 116. In a conventional transistor structure, the ILD material also fills into space occupied by dielectric 114, which would lead to a much deeper S/D contact trench formation during etch process between NFET and PFET, and this will lead to a greater parasitic capacitance between the gate and S/D contact. In this embodiment, dielectric 114 is formed between the NFET and PFET boundary with an additional etch stop liner 118 disposed thereon, such that contact 126 will stop on dielectric 114 and not go further in the N/P boundary region. Accordingly, this significantly reduces parasitic capacitance thereby improving the circuit performance.

Next, a conductive material is then deposited within the via. The conductive material for S/D contacts 126 can include any suitable conductive material such as, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a semiconductor structure comprising:

forming a plurality of vertical fins on a semiconductor substrate;

depositing a first dielectric layer in a shallow trench isolation region on the semiconductor substrate and between each of the vertical fins to expose a top portion of the vertical fins;

forming a plurality of dummy gate structures over a portion of each of the vertical fins;

depositing a hardmask on each of the dummy gate structures;

depositing a spacer layer on the exterior surfaces of the first dielectric layer, the dummy gate structures, the hardmask and the vertical fins;

depositing a second dielectric layer on a portion of the spacer layer;

recessing the spacer layer to below a top surface of the hardmask and a top surface of each of the vertical fins thereby exposing a portion of sidewalls of the hardmask and the vertical fins; and forming a source/drain region on the exposed portion of the vertical fins.

2. The method of claim 1, wherein the semiconductor substrate and each of the vertical fins comprise silicon.

3. The method of claim 1, wherein the second dielectric layer is recessed to below a top surface of the spacer layer.

4. The method of claim 1, further comprising:

depositing a contact etching stop layer on the source drain region, a top surface of the second dielectric layer and on the spacer layer disposed between adjacent dummy gate structures; and depositing an interlevel dielectric layer on the contact etching stop layer.

5. The method of claim 4, further comprising:

replacing the dummy gate structures with replacement metal gates; and depositing a self-aligned contact cap layer on a top surface of replacement metal gates.

6. The method of claim 5, wherein the replacement metal gates comprise a metal gate and a gate dielectric.

7. The method of claim 6, wherein the gate dielectric comprises a high-k dielectric material.

8. The method of claim 5, further comprising:

forming a source/drain contact trench by etching a portion of the interlevel dielectric layer, wherein the source/drain contact trench exposes at least a portion of the source/drain region; and depositing a first conductive metal in the source/drain contact trench.

9. The method of claim 8, wherein the first conductive metal comprises copper.

10. The method of claim 8, wherein the source/drain contact trench is separated from the shallow trench isolation region by at least the spacer layer.

11. The method of claim 1, wherein the plurality of vertical fins comprise a first set of vertical fins for forming a first field effect transistor device and a second set of vertical fins for forming a second field effect transistor device, wherein the first set of vertical fins are separated from the second set of vertical fins by the second dielectric layer disposed on the spacer layer.

12. The method of claim 11, wherein the first field effect transistor is a P-type field effect transistor and the second field effect transistor is a N-type field effect transistor.

13. The method of claim 1, wherein the first dielectric layer comprises $SiO_2$.

14. The method of claim 1, wherein the second dielectric layer comprises silicon carbide.

15. The method of claim 4, wherein the interlevel dielectric layer on the contact etching stop layer disposed between one of the adjacent dummy gate structures is replaced with a second conductive metal.

16. The method of claim 15, wherein the second conductive metal is the same as the first conductive metal.

17. The method of claim 4, wherein the contact etching stop layer comprises one or more of silicon nitride, silicon carbon nitride, carbon nitride, silicon oxynitride, and silicon carbon oxide.

18. A semiconductor structure comprising:
- a semiconductor substrate having a plurality of vertical fins;
- a first dielectric layer disposed in a shallow trench isolation region on a top surface of the semiconductor substrate and between each of the vertical fins to expose a top portion of the vertical fins;
- a plurality of dummy gate structures disposed over a portion of each of the vertical fins;
- a hardmask disposed on the dummy gate structures;
- a recessed spacer layer disposed on the exterior surfaces of the first dielectric layer, the dummy gate structures, the hardmask and the vertical fins, the recessed spacer layer configured to expose a portion of sidewalls of the hardmask and the vertical fins;
- a second dielectric layer disposed on a portion of the recessed spacer layer; and
- a source/drain region disposed on the exposed portion of the plurality of the vertical fins.

19. The semiconductor structure of claim 18, further comprising:
- a contact etching stop layer disposed on the source drain region, a top surface of the second dielectric layer and on the recessed spacer layer disposed between adjacent dummy gate structures; and
- an interlevel dielectric layer disposed on the contact etching stop layer.

20. The semiconductor structure of claim 18, wherein the semiconductor substrate and each of the vertical fins comprise silicon.

* * * * *